United States Patent [19]

Ono et al.

[11] Patent Number: 4,884,239

[45] Date of Patent: Nov. 28, 1989

[54] METHOD FOR ERASING DATA IN A SEMICONDUCTOR MEMORY DEVICE

[75] Inventors: Takashi Ono; Shooji Kitazawa, both of Tokyo, Japan

[73] Assignee: Oki Electric Industry Co., Ltd., Tokyo, Japan

[21] Appl. No.: 177,612

[22] Filed: Apr. 5, 1988

[30] Foreign Application Priority Data

Apr. 6, 1987 [JP] Japan ................................. 62-82988

[51] Int. Cl.$^4$ ............................................. G11C 11/34
[52] U.S. Cl. ....................................... 365/185; 365/218
[58] Field of Search ....................... 365/182, 185, 218; 357/23.5

[56] References Cited

U.S. PATENT DOCUMENTS

4,375,087 2/1983 Wanlass ................................ 365/218
4,462,089 7/1984 Miida ................................... 365/185

Primary Examiner—Joseph A. Popek
Attorney, Agent, or Firm—Koda & Androlia

[57] ABSTRACT

The invention concerns a method for electrically erasing data stored in a FAMOS-type EPROM. That is, in an Electrically Programmable Read Only Memory of the Metal Oxide Semiconductor type in which a Floating gate is employed as a memory element and in which data-writing is effected by charge injection from a channel Avalanche current, the invention concerns a method for effectively removing such channel-injected charge from a subject written floating gate. The method specifically entails the injection into the written gate of neutralizational opposing-polarity hot carriers from a generated reverse avalanche current between the MOS drain and substrate. The drain avalanche, however, is limited to "non-breakdown" levels by a technique which, in addition to appropriate drain biasing, includes suitable source and control-gate biasing so as to essentially prevent the flow of channel current during erasure. The method is applicable to either n-channel or p-channel devices and does not require the use of a separate select transistor.

19 Claims, 12 Drawing Sheets

METHOD FOR ERASING DATA IN A SEMICONDUCTOR MEMORY DEVICE

BACKGROUND OF THE INVENTION

1. Field of the Invention

The invention relates in general to semiconductor memory devices and in particular to methods for erasing data stored in such devices, and specifically concerns a method for electrical erasing data stored in a FAMOS-type Electrically Programmable Read Only Memory (EPROM) in which a Floating gate Avalanche injection MOS transistor is employed as a memory element and in which data-writing is effected by charge injection from a channel Avalanche current.

2. Prior Art

Examples of technical literature concerning conventionally erasable EPROMs include the following:

(a) "Modern MOS Technology", Dewitt G. Ong, p. 212–216, McGraw-Hill Book Company;

(b) "Comparison and Trends in Today's Dominant $E^2$ Technologies", '86 IEDM 26–1.

Figure 1:
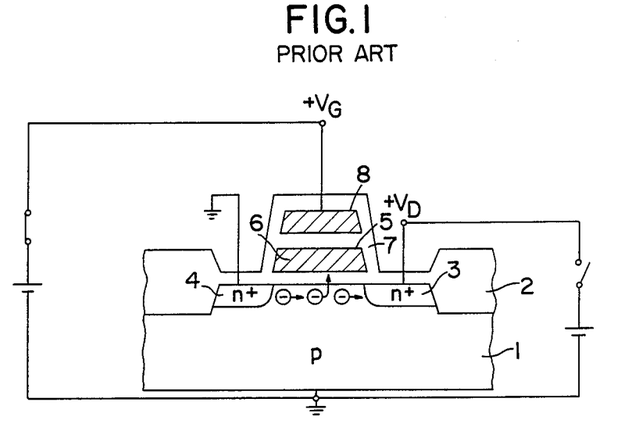
FIG. 1 is a cross sectional view of a conventional FAMOS-type (Floating-gate, Avalanche-injection, Metal-Oxide Semiconductor) EPROM.

A first type of erasable EPROM from the cited reference (a) is presented in FIG. 1. FIG. 1 is a cross sectional view of an EPROM cell of the FAMOS type (Floating-gate, Avalanche-injection Metal Oxide Semiconductor). In FIG. 1, 1 indicates a p-type substrate, 2 a field oxide film, 3 an n+ diffusion layer which acts as a drain, 4 an n+ diffusion layer which acts as a source, 5 a gate oxide film, 6 a first-level polysilicon which acts as a floating gate, 7 an oxide film and 8 a second-level polysilicon which acts as a control gate.

In a conventional EPROM of this nature, the writing of data is performed electrically. Specifically, when data is to be written, a voltage of 12 to 25 volts is applied to the second-level polysilicon control-gate 8, and a pulse of 7 to 20 volts is applied to the drain n+ diffusion layer 3. A large current, comprised in significant part of an impact avalanche breakdown, is thereby caused to flow between the source 4 and the drain 3, and some of the associated "hot" electrons reach the first-level polysilicon 6 along the electric field in the direction of the gate 8. Because the polysilicon gate 6 is rendered electrically floating by virtue of being completely surrounded by an insulating film of $SiO_2$, injected hot electrons accumulate within the gate. The threshold voltage $V_T$ of a memory cell in which a charge has thus been accumulated is high, with the consequent absence of significant current at a time of cell reading thereby typically providing an indication of data having in this fashion been electrically written.

In contrast, the associated erasing of data is accomplished non-electrically by exposing the EPROM to ultraviolet light. Such light excites the electrons in a written floating gate, thus imparting them with sufficient energy to leave the gate, and thereby returning the gate to its unwritten state.

A second general category of subject devices is the $E^2$PROMs (Electrically Erasable and Programmable ROMs), in which both writing and erasing are accomplished electrically. As indicated in the above-mentioned references (a) and (b), three types of such $E^2$PROMs have been proposed. In all of these $E^2$PROMs, however, writing and erasing are accomplished by means of a tunnel current through an insulating film.

Figure 2:
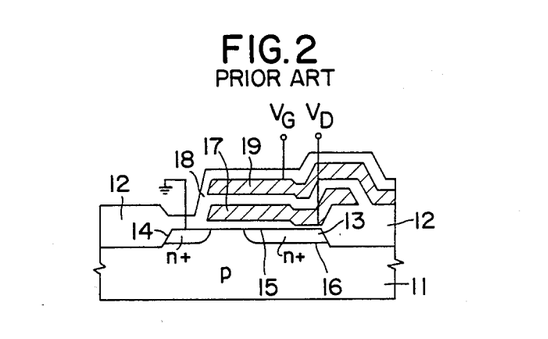
FIG. 2 is a cross sectional view of a conventional FLOTOX-type (Floating-gate, Tunnel-Oxide) $E^2$PROM (Electrically Erasable PROM).

FIG. 2 thus first shows a cross sectional view of a conventional FLOTOX-type (Floating-Gate, Tunnel-Oxide) $E^2$PROM cell. In this figure, 11 indicates a p-type substrate, 12 a field oxide film, 13 an n+ diffusion layer which acts as a drain, 14 an n+ diffusion layer which acts as a source, 15 gate oxide film, 16 a tunnel oxide film, 17 a first-level polysilicon which acts as a floating gate, 18 an oxide film and 19 a second-level polysilicon film which acts as a control gate. As is shown in the Figure, a portion of the gate oxide film 15 is configured to form a thin tunnel oxide film 16, through which electrons can be tunneled into or from the floating gate 17 under appropriate conditions.

Figure 3:
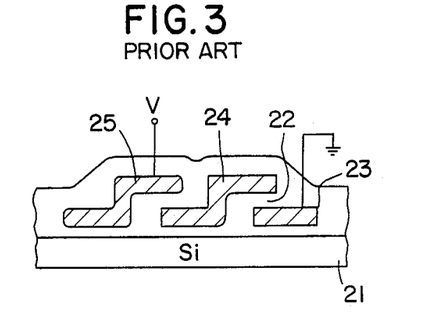
FIG. 3 is a cross sectional view of a conventional textured-poly type $E^2$PROM.

FIG. 3 next shows a cross sectional view of a second type of conventional $E^2$PROM cell, namely the textured-poly type. Numeral 21 thus indicates a silicon substrate, 22 an oxide film, 23 a first-level polysilicon, 24 a second polysilicon which, surrounded by the oxide film 22, acts as a floating gate, and 25 a third polysilicon. Tunneling through the oxide film 22, from the first polysilicon 23 to the gate 24 in the case of writing and from the gate 24 to the third polysilicon 25 in the case of erasing, is again the operative charge-transfer mechanism.

Figure 4:
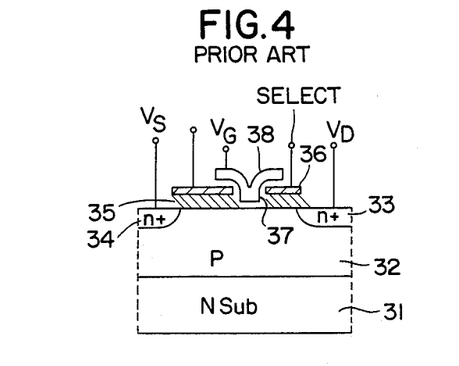
FIG. 4 is a cross sectional view of a conventional MNOS-type (Metal Nitride Oxide Silicon) $E^2$PROM.

A third type of conventional $E^2$PROM is presented in the cross sectional view of FIG. 4. This is the MNOS-type (Metal Nitride Oxide Silicon) $E^2$PROM cell. Numeral 31 thus indicates an n-type substrate, 32 a p well, 33 an n+ diffusion layer which acts as a drain, 34 an n+ diffusion layer which acts as a source, 35 indicates an oxide film, 36 a first polysilicon, 37 a silicon nitride film, and 38 a second polysilicon. This type of device is designed so that a charge is stored in the silicon nitride film 37. Writing and erasing of data are accomplished by means of a tunnel current in the same general manner as with the other $E^2$PROMs previously discussed.

All of the above-mentioned devices suffer from a number of drawbacks, which include the following: First, in the case of the EPROM illustrated in FIG. 1, the erasing of data is accomplished by exposure to ultraviolet light. A window must accordingly be formed in the package in order to allow for the passage of such light. As a result, the assembly process is complicated, costs may be increased, and an ultraviolet irradiation apparatus is required.

In the case secondly of the three types of $E^2$PROMs illustrated in FIGS. 2 through 4, $V_T$ following erasing drops excessively, so that the characteristics of a depletion-type transistor are exhibited. Accordingly, each cell must supplementally include one select transistor with a constant $V_T$. As a result, the required cell area is increased.

Furthermore, in the case of the FLOTOX-type $E^2$PROM illustrated in FIG. 2, an additional tunnel-oxide film-formation process is required. Likewise, an additional third polysilicon formation process is required in the case of the textured-poly type $E^2$PROM illustrated in FIG. 3, and an additional silicon-nitride film-formation process is required in the case of the MNOS-type $E^2$PROM illustrated in FIG. 4.

SUMMARY OF THE INVENTION

It is accordingly a primary object of the present invention to enable data stored in a semiconductor memory device to be erased electrically, without the necessity for ultraviolet light, complex manufacturing processes or excess surface area.

The drawbacks of the prior art are overcome by the present invention which generally encompasses a method for electrically erasing data in a FAMOS-type EPROM. That is, in an Electrically Programmable Read Only Memory of the Metal Oxide Semiconductor type in which a Floating gate is employed as a memory element and in which data-writing is effected by charge injection from a channel Avalanche current, the invention concerns a method for effectively removing such channel-injected charge from a subject written floating gate. The method more-specifically entails the injection into the written gate of neutralizational opposing-polarity hot carriers from a generated reverse avalanche current between the MOS drain and substrate. The drain avalanche, however, is limited to "non-breakdown" levels by a technique which, in addition to appropriate drain biasing, includes suitable source and control-gate biasing so as to essentially prevent the flow of source-junction and channel currents during erasure.

The "non-breakdown" requirement is preferably realized in terms of an operational restriction of the subject drain-avalanche currents to levels of approximately 200 μA or less.

The method is applicable to either n-channel or p-channel devices and does not require the use of a separate select transistor.

BRIEF DESCRIPTION OF THE DRAWINGS

FIGS. 1 through 4 schematically represent prior-art approaches to the erasure of data in Electrically Programmable Read Only Memories.

FIGS. 5 through 12 are illustrative of various aspects of the present invention.

DETAILED DESCRIPTION OF THE INVENTION

Various embodiments of the present invention will now be described in detail with reference to the accompanying figures.

Figures 5, 6A:
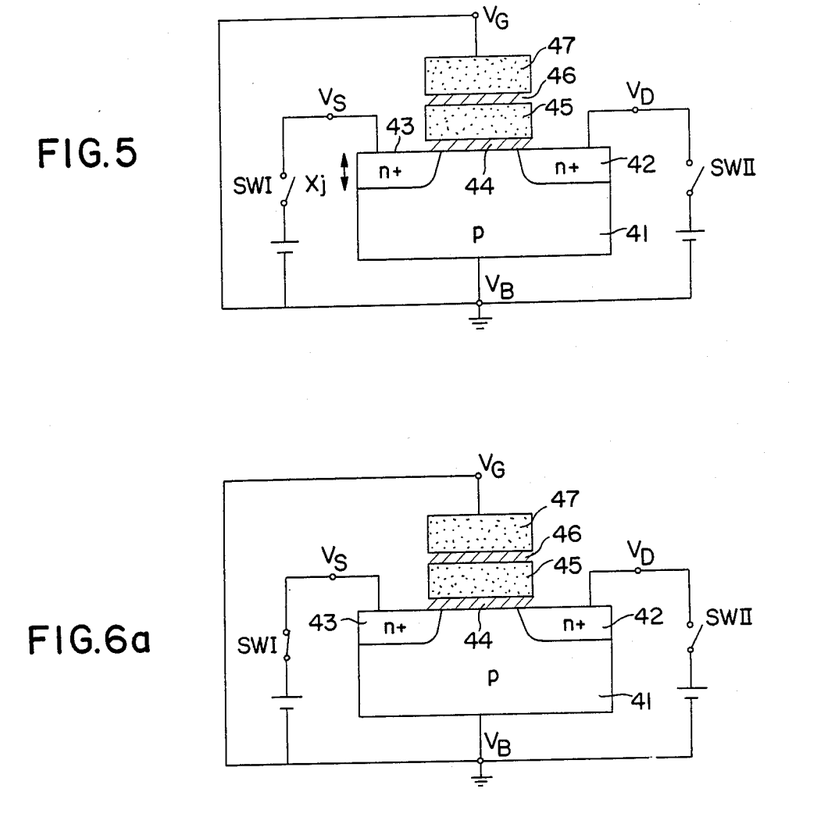
FIG. 5 is a schematic diagram of certain aspects of one type of MOS EPROM cell which embodies the method of the present invention.
FIGS. 6a and 6b schematically illustrate certain procedural steps entailed in one realization of the method of the present invention, as applied to the erasing of data from the memory-cell embodiment of FIG. 5.

In the FIG. 5, which is a schematic diagram of certain aspects of one type of MOS EPROM cell which embodies the method of the present invention, 41 indicates a p-type silicon substrate, 42 a drain n+ diffusion layer which is formed on substrate 41, 43 another n+ diffusion layer which acts as a source, 44 a first gate oxide film, 45 a first polysilicon layer which acts as a floating gate, 46 a silicon oxide film on top of first polysilicon 45, and 47 a second polysilicon layer which acts as a control gate.

A realization of the EPROM cell shown in FIG. 5 may then comprise a first gate-oxide film 44 with a film thickness of 300 A formed on a p-type silicon substrate 41, a first polysilicon layer 45 with a film thickness of 3000 A formed on top of the gate-oxide film 44, an oxide film 46 with a film thickness of 400 A formed on top of the polysilicon layer 45, and a second polysilicon layer 47 with a film thickness of 3000 A formed on top of the oxide film 46. The EPROM cell is formed using a self-aligning technique. Furthermore, the depth $x_j$ of the each of the n+ diffusion layer 42 which acts as a drain and the n+ diffusion layer 43 which acts as a source is approximately 0.25 microns, the effective gate length of the EPROM cell is 0.8 microns (actual gate length: 1.2 microns), and the initial cell threshold voltage of an EPROM cell which has been erased by ultraviolet light, is 1.8 V. (This initial value is indicated as $V_{TI}$ in the below-discussed FIG. 7).

It will parenthetically be apparent to those skilled in the art that certain aspects of the present-device configurations as illustrated for example in FIG. 5 are basically for the purpose of discussing the data-erasing phases of the invention. Thus the gate circuit, for example, would in a realization typically not be fixedly connected to ground and would instead include appropriate switching mechanisms for the selective alternative application of data-write, data-read and data-erase voltages.

Figure 7:
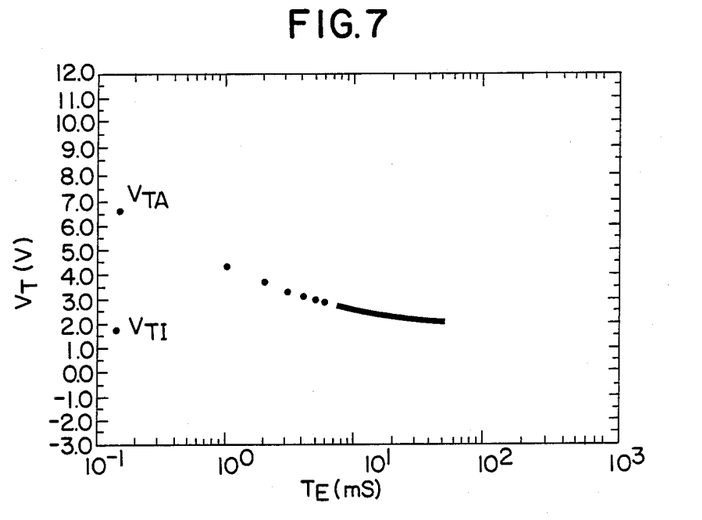
FIG. 7 is a graph of typical erasing time associated with the present invention, in terms of cell threshold voltage as influenced by retained charge on the floating gate and referenced to an actual high $V_{TA}$ achieved immediately after channel-injective writing and a theoretical low $V_{TI}$ which would be obtained through the use of ultraviolet light.

The writing of data into the memory cell shown in FIG. 5 may then be accomplished as follows: First, conditions are set so that the gate voltage $V_G=13$ V and the source voltage $V_S=$ the substrate voltage $V_B=0$ V; in this state, a pulse voltage of $V_D=8$ V is applied to the drain 42 for 0.1 msec. A part of the channel current results in a negative-carrier (i.e., electron) charge being injected into the floating gate in the same manner as in the conventional example shown in FIG. 1. The threshold voltage $V_T$ of the cell consequently rises from 1.8 V to approximately 6 V, and data is written. This immediate post-writing threshold is indicated in FIG. 7 as $V_{TA}$.

It will also be apparent to those skilled in the art that in this writing of data, the source potential and base potential do not necessarily have to be set at ground. Various different settings may be employed with a view toward optimizing the writing conditions in given actual operational environments.

Figure 6B:
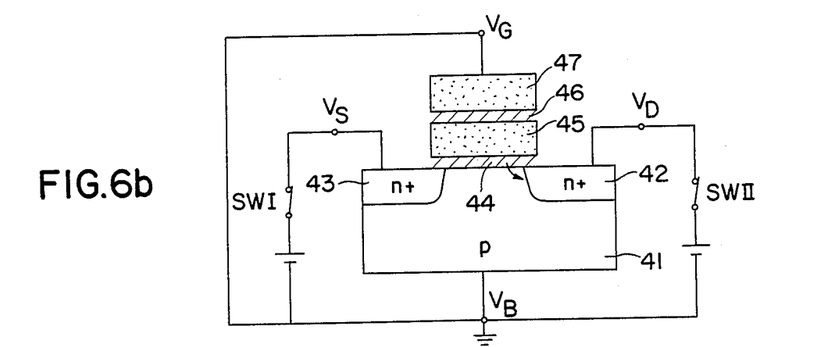

With reference next to the schematic sequence illustrations of FIGS. 6a and 6b, one embodiment of the method for erasing this data written in the memory cell will now be described: In general, a reverse bias voltage of approximately 2 to 3 V is applied to the source so that essentially no current will flow from the source to the substrate. In addition, the control gate is also appropriately biased so that there will be essentially no flow of channel current either. When a reverse bias of approximately 14 V is then applied between the drain and substrate, a current-avalanche effect is produced in the vicinity of the drain junction beneath the gate oxide film. This avalanche comprises for example hot positive-carrier holes which in turn become injected into the floating gate, thereby neutralizing the previously channel-injected opposite-carrier charge.

More specifically, as shown in FIG. 6a, the switch I is first closed and the switch II is opened, so that $V_G = V_B = 0$ V and $V_S = 2$ V are applied to the cell. Next, as shown in FIG. 6b, the switch II is closed, and a pulse of $V_D = 14$ V is applied to the drain 42, thereby effecting erasure. Thus by appropriate alterations in applied voltages, not only the writing of data but also the erasing of data can be accomplished electrically.

FIG. 7 shows the relationship between applied erase-pulse duration-time $T_E$ and resultant $V_T$ under these conditions. It is seen from FIG. 7 that in the case of a cell in which $V_{TA}$ is 6.6 V, the value of $V_T$ drops to 2.0 V after a 50-msec application, so that the cell almost returned to its original, pre-writing state. After approximately this 50 msec, moreover, the erasure curve becomes essentially asymptotic.

Under the bias conditions obtained during the aforementioned erasing operation, an avalanche current flows across the drain junction. This current, however, is extremely small, i.e., approximately 100 microA. The reason for this is that the source voltage $V_S$ is high at 2 V, which, along with a control-gate voltage of 0 V, allows essentially no current to flow between the source and drain. It may be conjunctively noted that it would also be possible to erase data even if the source voltage were set at 0 V. In this case, however, breakdown would occur, with drain current becoming excessively large, and thereby creating the possibility of wiring melt-down or thermal destruction of the cell.

Figure 8:
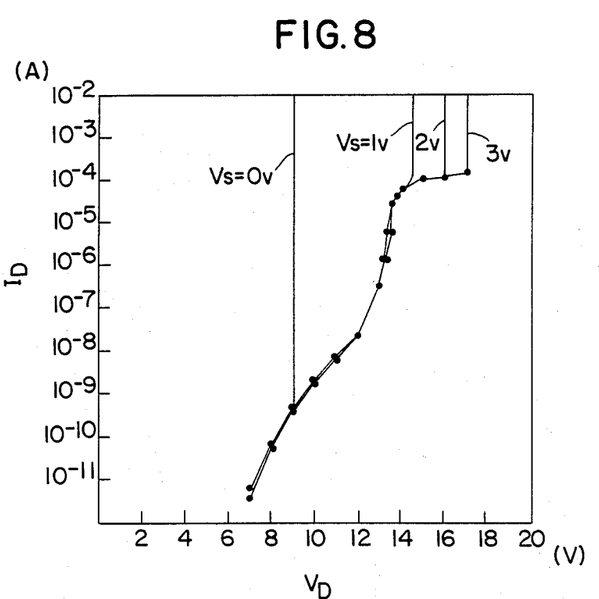
FIG. 8 is a graph of erasure-mode drain current vs drain voltage characteristics obtained with the floating-gate potential $V_{FG}$ fixed at 0 volts.

FIG. 8 shows a chart of drain current vs drain voltage characteristics obtained with the floating-gate potential $V_{FG}$ actually fixed at 0 V. Here the source voltage $V_S$ was taken as a parameter, and the substrate potential was 0 V. As shown, a current caused by the avalanche effect begins to flow when $V_D$ exceeds 7 V. Because holes generated by the aforementioned avalanche then flow to the substrate as a so-called "substrate current", the potential of this p-type substrate in the vicinity of the source and drain becomes higher than ground potential. Accordingly, when the source voltage $V_S$ is 0 V, even a slight avalanche will readily forward-bias the np junction between the source and substrate. As a result, the net sequence of (a) injection of electrons from the source electrode, (b) acceleration of these injected electrons to the drain and (c) occurrence of a secondary avalanche in the vicinity of the drain, continues until breakdown eventually occurs. In the case of $V_S = 0$ V, the breakdown voltage is approximately 9 V. However, if the source voltage $V_S$ is maintained at a positive voltage, i.e., if the np junction is maintained in a reverse-biased state, the forward-biased condition of the source-substrate junction caused by the aforementioned avalanche tends not to occur. Accordingly, even if the drain voltage rises somewhat and the avalanche current increases, the voltage tends not to reach breakdown levels. Actually, as is seen from FIG. 8, the drain voltage $V_D$ and drain current $I_D$ at which breakdown occurs increase as the source voltage $V_S$ is increased from 1 V to 3 V. This indicates that reverse biasing of the source with respect to the substrate makes it possible to maintain the avalanche phenomenon in a location which contributes to erasing, while avoiding the occurrence of breakdown (which would otherwise result in the flow of an excessively large current).

It may be noted parenthetically that the described affirmative positive biasing of the source is typically not the only way of avoiding an excessive drain-current breakdown. This objective could also be achieved by biasing the substrate $V_B$ to (e.g.) $-3$ V. Furthermore, even if the source potential is allowed to be electrically floating, the subject source electrode would float to a positive potential during erasing due to leakage current between the source and drain. The net effect would accordingly be the same as that obtained by affirmative source biasing.

Figure 9:
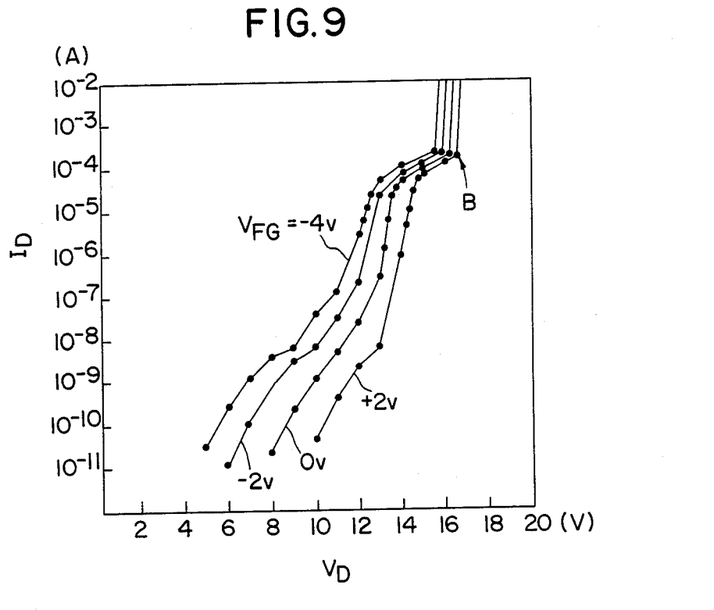
FIG. 9 is a graph of erasure-mode drain current vs drain voltage characteristics obtained with the source voltage $V_S$ fixed at 2 volts.

FIG. 9 next shows the drain current-vs-drain voltage characteristics with the source voltage $V_S$ fixed at 2 V. Here, the floating gate potential $V_{FG}$ was taken as a parameter, and the substrate potential was 0 V. The Figure shows that avalanche occurs at successively lower drain voltages as $V_{FG}$ decreases. The reason for this is that the electric field in the vicinity of the pn drain junction increases in strength as the floating-gate potential $V_{FG}$ drops.

In an actual EPROM cell, the floating-gate voltage $V_{FG}$ is determined by capacitive coupling with the control-gate voltage $V_G$, the drain voltage $V_D$, the source voltage $V_S$ and the substrate voltage $V_B$. However, it is predicted that under bias conditions such as those of the aforementioned erasing example, $V_{FG}$ would be approximately $-2$ V in a subject cell after writing (with electrons stored). Furthermore, it is predicted that this would become changed to approximately $+2$ V after the completion of erasing.

In FIG. 9, the drain-current characteristics during data erasing change successively as $V_{FG}$ is changed from $-2$ V to $+2$ V. The following point is worth noting in this regard: When, for example, $V_D = 14$ V, the drain current $I_D$ flows at about 100 microA across a $V_{FG}$ range of $-4$ to 0 V. However, when $V_{FG} = 2$ V, $I_D$ drops abruptly to about 1 microA. This accordingly provides a rationale for the asymptotic erasing behavior exhibited in FIG. 7. As erasing proceeds, the avalanche-induced injection of opposite carriers progressively neutralizes a written, and in the on-going example, negatively charged floating gate. $V_{FG}$ accordingly becomes progressively less negative. Once $V_{FG}$ rises above a certain value, however, the avalanche current abruptly decreases, so that erasing reaches saturation. This phenomenon can be exploited to preselect the $V_T$ to a desired value in the desired operation.

It is more-generally apparent from FIGS. 8 and 9 that for any given set of operational conditions, there tends to be a predeterminable point along the current/voltage characteristic after which operationally-unstable breakdown occurs. Such a point is exemplified by point "B" on the $V_{FG} = 2$ V curve in FIG. 9. It is thus a basic objective of the present invention to restrict memory operation, at least in its drain-erasure-current performance, to the non-breakdown region, where the avalanche current is approximately stable below such points. In actual realizations, this objective is typically achievable by pre-selecting some level preferably below a given material-specific breakdown point as a current-limit threshold which then serves as a practical design criterion with respect to which cell parameters are in turn chosen so as to avoid the unstable operational regions. For the embodiments previously discussed above, a limit of approximately 200 microA may accordingly be regarded as an example "no-more-than" design-criterion breakdown-threshold of this nature.

Figure 10:
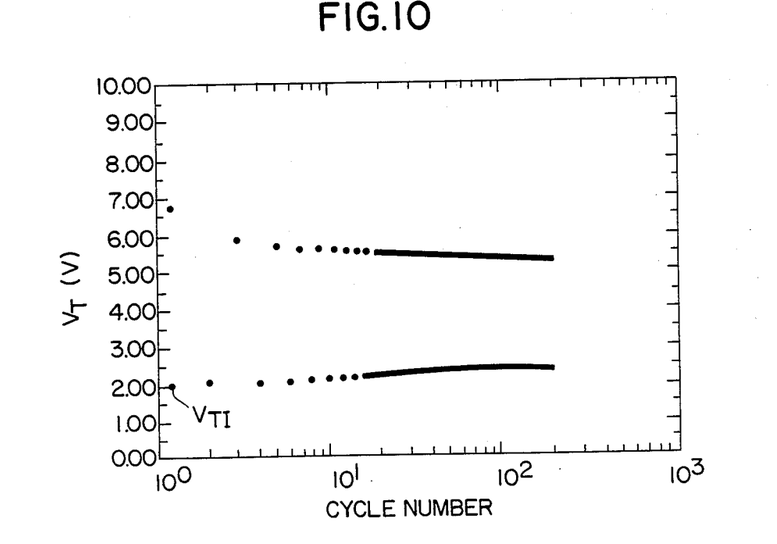
FIG. 10 is a graph of post-writing (upper plot) and post-erasing (lower plot) threshold voltage against writing/erase cycle number.

FIG. 10 shows the post-writing (upper plot) and post-erasing (lower plot) $V_T$ characteristics obtained in the case of repeated writing and erasing of one of the aforementioned memory cells using the method described above. Here, the writing time in each cycle was 0.1 msec, while the associated erasing time per-cycle was 100 msec. Even after 200 cycles (100 writing operations plus 100 erasing operations), the difference between $V_T$ after writing and $V_T$ after erasing was approximately 3 V, an amount sufficient for read-voltage-straddling in memory use.

A number of the resultant advantages of the present invention will now be summarized. First, as has been described above, the erasing of data stored in an EPROM cell which comprises a FAMOS (Floating Gate Avalanche Injection type MOS) transistor may now be accomplished without resort to ultraviolet light as in a conventional device. The erasure may instead be accomplished electrically by simply an appropriate alteration in the applied voltage ensemble (i.e., writing-to-erasing alterations which are such that a reverse avalanche current of 200 $\mu$A or less flows between the drain and the substrate). Combined electrical-writability / electrical-erasability is thus readily achievable. All of the required voltages, moreover, will typically be available from the associated circuit board. Accordingly, the erasing of data, which has conventionally required removing the semiconductor chips from the board and setting them in an ultraviolet irradiation apparatus, can be accomplished with the chips still attached to the board. The consequent ease with which on-chip data may be altered, while of obvious direct-utilization benefit to an ultimate end user, also contributes to improved point-of-origin quality control in that full testing of newly-manufactured ROMs is significantly facilitated by virtue of test patterns prior to device delivery.

Second, since $V_T$ after erasing is asymptotically stable, there is no need for a select transistor, as there is in the case of a conventional E²PROM. Individual cell area can accordingly be made smaller, and may in fact be reduced to proportions comparable to those of a FAMOS-type EPROM. The elimination of the need for the select transistor additionally leads to device-cost reductions, not only because of a lowered per-cell element count but also because of associated simplifications in the manufacturing process. Manufacturing simplifications also devolve from the less-critical FAMOS-correspondent, as opposed to tunnel-correspondent, structural nature of individual cell elements.

Third, the availability of a practicable avalanche-referenced erasure method in turn renders practicable the use of avalanche-referenced writing, which can be performed at higher speeds than tunnel-referenced E²PROM writing.

It is to be noted in addition that the practice of the present inventive method is not limited to the example context of the n-channel type MOS transistor used in the embodiment described above. Analogous operations can as well be performed using p-channel devices.

Figure 11:
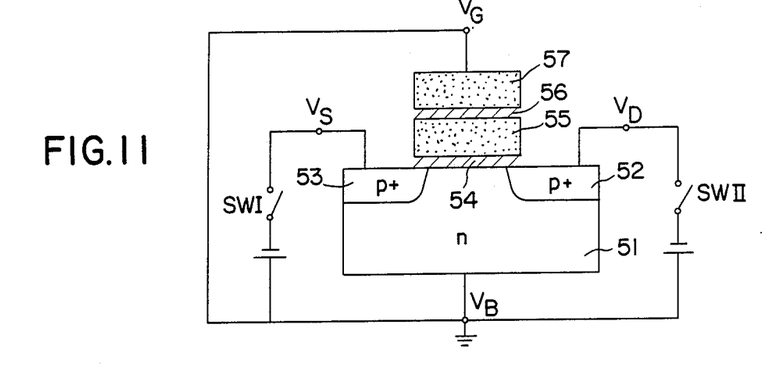
FIG. 11 is a schematic illustration of certain aspects of a p-channel MOS EPROM in which the present invention may be embodied, in alternative contrast with the n-channel cell of FIG. 5.
Figure 12A:
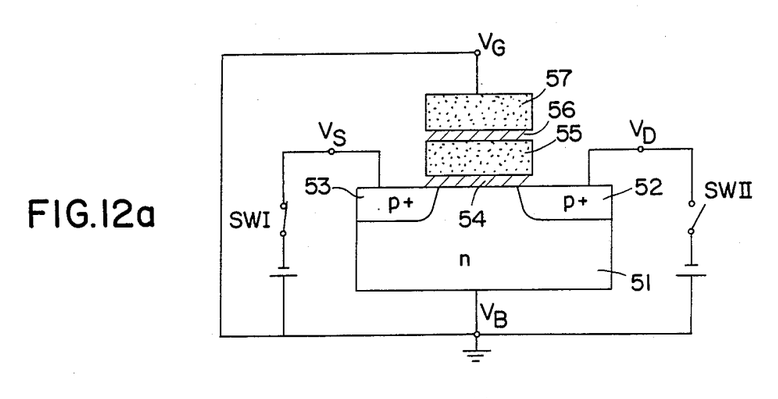
FIGS. 12a and 12b are schematic illustrations of certain aspects of the practice of the present invention in the alternative context of the device of FIG. 11.
Figure 12B:
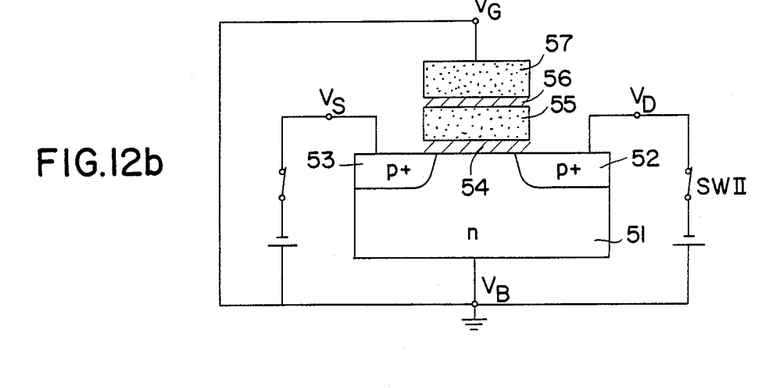

FIG. 11 is thus a schematic diagram of certain aspects of a pMOS-type EPROM cell which can accordingly be used to alternatively embody the subject method. FIGS. 12a and 12b then correspondingly illustrate various aspects of the present erasure method with respect to such a p-channel device.

In FIG. 11, numeral 51 indicates an n-type silicon substrate, 52 a drain p+ diffusion layer which is formed on this substrate 51, 53 another p+ diffusion layer which acts as a source, 54 a first gate oxide film, 55 a first polysilicon layer which acts as a floating gate, 56 a silicon-oxide film which is formed on top of first polysilicon 55, and 57 a second polysilicon layer which acts as a control gate.

The method used to erase data stored in this pMOS-type ROM cell is similar to the method used to erase data stored in the aforementioned nMOS-type ROM cell. First, as is shown in FIG. 12a, the switch I is closed, and applied to the source 53 is a voltage of −2 to −3 V with respect to the substrate potential, so that said source is negatively biased. In addition, the potential of control-gate 57 is set at 0 V, i.e., at a potential which prevents the flow of channel current. Afterward, as shown in FIG. 12b, the switch II is closed and applied to drain 52 is a voltage of approximately −14 V with respect to the substrate potential, so that the drain is set at a negative potential which allows a drain current of 200 $\mu$A or less. As a result, a positive charge accumulated by writing in the aforementioned floating gate 55 is removed.

In terms of the above-described example embodiments, the present invention in certain of its aspects may now be recapitulated in the following example form:

In the context of a semiconductor memory device in which the writing of data is performed by (1) using an MOS transistor as a memory unit which has a control gate and a floating gate, (2) setting the source potential and substrate potential of the abovementioned MOS transistor at ground potential or in the vicinity of ground potential, (3) setting the control-gate potential of the transistor at a high potential which allows a channel current to flow between the source and drain of the transistor, (4) setting the drain potential of the transistor at a prescribed potential which is lower than the abovementioned control-gate potential, and (5) causing a channel current to flow between the abovementioned source and drain so that an electrical charge is injected into the abovementioned floating gate, the invention provides for the subject injected electrical charge to be effectively erased by (A) setting the abovementioned control-gate potential at a lower potential which does not allow a channel current to flow between the abovementioned source and drain, (B) applying a reverse bias voltage so that no current is allowed to flow between the abovementioned source and substrate, and (C) applying between the abovementioned drain and substrate a prescribed reverse bias voltage which is larger than the reverse bias voltage applied between the abovementioned source and substrate, so that an avalanche current of 200 $\mu$A or less is caused to flow between the abovementioned drain and substrate.

It will in any event be apparent to those skilled in the art that the present invention is not limited to the explicitly described embodiments. Various modifications based on the spirit of the present invention are possible; all of these modifications are included in the scope of the present invention.

We claim:

1. A method for erasing data stored in a semiconductor memory device, wherein the device comprises an MOS transistor having a substrate, a source formed on said substrate, a drain formed on said substrate at a distance from said source, and a control gate and a floating gate as a memory unit, and wherein data writing is effected by the generation of an MOS-channel current of sufficient magnitude so that an electrical charge is injected into said floating gate, this data-erasure method being characterized in that said injected electrical charge is effectively removed by:

applying between said control gate and the substrate a predetermined potential which allows essentially no channel region to be created on said substrate between said source and said drain;

applying between said source and said substrate a first predetermined reverse-bias voltage of sufficient magnitude so as to allow essentially no current to flow between said source and said substrate; and applying between said drain and substrate a second predetermined reverse-bias voltage which is greater than said first predetermined reverse bias voltage so as to allow an avalanche current to flow between said drain and said substrate and no channel current to flow between said source and said drain.

2. A method for erasing data according to claim 1 in which:

said avalanche current is less than approximately 200 $\mu$A.

3. A method for erasing data according to claim 1 in which:

said MOS transistor is an n channel MOS transistor;

said electrical charge injected into and effectively removed from said floating gate comprises electrons; and said first and second reverse-bias voltages during said erasing are positive.

4. A method for erasing data according to claim 1 in which:

said MOS transistor is a p channel MOS transistor;

said electrical charge injected into and effectively removed from said floating gate comprises holes; and said first and second reverse-bias voltages during said erasing are negative.

5. A method for erasing data stored in a semiconductor memory device, wherein the device comprises an MOS transistor having a substrate, a source formed on said substrate, a drain formed on said substrate at a distance from said source, and a control gate and a floating gate as a memory unit, and wherein the writing of data includes the steps of setting the source and substrate of said MOS transistor at an essentially-common reference first potential;

setting the drain of said MOS transistor at a predetermined second potential; and setting said control gate at a predetermined third potential, where said gate potential is greater than said drain potential, and where said respective gate and drain potentials are mutually selected to cause a channel current of sufficient magnitude between said source and drain so that an electrical charge is injected into said floating gate; the subject data-erasure method being characterized in that said electrical charge injected into said floating gate is effectively removed by:

applying between said control gate and the substrate a predetermined fourth potential which allows essentially no channel region to be created on said substrate between said source and said drain;

applying between said source and said substrate a predetermined reverse-bias fifth potential of sufficient magnitude so as to allow essentially no avalanche current to flow between said source and said substrate; and applying across said drain and said substrate a predetermined reverse-bias sixth potential which is of greater effective operational magnitude than said source bias so as to allow an avalanche current to flow between said drain and said substrate and no channel current to flow between said source and said drain.

6. A method for erasing data according to claim 5 in which:

said avalanche current is less than approximately 200 $\mu$A.

7. A method for erasing data according to claim 5 in which:

said common reference potential for said source and substrate during data-writing is approximately ground potential.

8. A method for erasing data according to claim 5 in which:

said drain potential of said MOS transistor during charge-removal erasure is different from that during charge-injection writing.

9. A method for erasing data according to claim 5 in which:

said source potential of said MOS transistor during charge-removal erasure is different from that during charge-injection writing.

10. A method for erasing data according to claim 5 in which:

said MOS transistor is an n channel MOS transistor;

said electrical charge injected into and effectively removed from said floating gate comprises electrons; and said reverse-bias voltages during said erasing are positive.

11. A method for erasing data according to claim 5 in which:

said MOS transistor is a p channel MOS transistor;

said electrical charge injected into and effectively removed from said floating gate comprises holes; and said reverse-bias voltages during said erasing are negative.

12. A method for erasing data stored in a semiconductor memory device, wherein the device comprises an MOS transistor having a substrate, a source formed on said substrate, a drain formed on said substrate at a distance from said source, and a control gate and a floating gate as a memory unit, and wherein data writing is effected by the generation of an MOS-channel current of sufficient magnitude so that an electrical charge is injected into said floating gate, this data-erasure method being characterized in that said injected electrical charge is effectively removed by:

applying between said control gate and the substrate of said MOS transistor at a predetermined potential which allows essentially no channel region to be created between said control gate and said substrate;

setting a potential of said source to be electrically floating so as to allow essentially no avalanche current to flow between said source and said substrate; and applying between said drain and said substrate a second predetermined reverse-bias voltage so as to allow an avalanche current to flow between said drain and said substrate and no channel current to flow between said source and said drain.

13. A method for erasing data according to claim 12 in which:

said avalanche current is less than approximately 200 µA.

14. A method for erasing data according to claim 12 in which:

said MOS transistor is an n channel MOS transistor;

said electrical charge injected into and effectively removed from said floating gate comprises electrons; and said reverse-bias voltages during said erasing are positive.

15. A method for erasing data according to claim 12 in which:

said MOS transistor is a p channel MOS transistor;

said electrical charge injected into and effectively removed from said floating gate comprises holes; and said reverse-bias voltages during said erasing are negative.

16. A method for erasing data stored in a semiconductor memory device, wherein the device comprises an MOS transistor having a substrate, a source formed on said substrate, a drain formed on said substrate at a distance from said source, and a control gate and a floating gate as a memory unit, and wherein the writing of data includes the steps of setting the source and substrate of said MOS transistor at an essentially common reference first potential; setting the drain of said MOS transistor at a predetermined second potential; and setting said control gate at a predetermined third potential, where said gate potential is greater than said drain potential, and where said respective gate and drain potentials are mutually selected to cause a channel current of sufficient magnitude between said source and drain so that an electrical charge is injected into said floating gate; the subject data-erasure method being characterized in that said electrical charge injected into said floating gate is effectively removed by:

applying between said control gate and said substrate at a predetermined potential which allows essentially no channel region to be created between said control gate and said substrate;

setting a potential between said source to be electrically floating so as to allow essentially no avalanche current to flow between said source and said substrate; and applying between said drain and said substrate a predetermined reverse-bias sixth potential which is of greater effective operational magnitude than said source bias so as to allow an avalanche current to flow between said drain and said substrate and no channel current to flow between said source and said drain.

17. A method for erasing data according to claim 16 in which:

said avalanche current is less than approximately 200 µA.

18. A method for erasing data according to claim 16 in which:

said MOS transistor is an n channel MOS transistor;

said electrical charge injected into and effectively removed from said floating gate comprises electrons; and said reverse-bias voltages during said erasing are positive.

19. A method for erasing data according to claim 16 in which:

said MOS transistor is a p channel MOS transistor;

said electrical charge injected into and effectively removed from said floating gate comprises holes; and said reverse-bias voltages during said erasing are negative.

* * * * *